United States Patent [19]

Sugino

[11] Patent Number: 5,297,071
[45] Date of Patent: Mar. 22, 1994

[54] ARITHMETIC CIRCUIT, AND ADAPTIVE FILTER AND ECHO CANCELER USING IT

[75] Inventor: Kimihiro Sugino, Ohme, Japan
[73] Assignee: Hitachi, Ltd., Tokyo, Japan
[21] Appl. No.: 843,538
[22] Filed: Feb. 28, 1992

[30] Foreign Application Priority Data

Mar. 29, 1991 [JP] Japan .................................. 3-091156

[51] Int. Cl.[5] .............................................. G06F 7/00
[52] U.S. Cl. .................................................... 364/736
[58] Field of Search ............................ 364/736, 724.01

[56] References Cited

U.S. PATENT DOCUMENTS

| | | | |
|---|---|---|---|
| 4,736,288 | 4/1988 | Shintani et al. | 364/736 |
| 4,785,393 | 11/1988 | Chu et al. | 364/756 |
| 4,942,547 | 7/1990 | Joyce et al. | 364/736 |
| 5,142,489 | 8/1992 | Yamaki | 364/736 |

OTHER PUBLICATIONS

K. Kloker, "The Motorola DSP56000 Digital Signal Processor", IEEE Micro, Dec. 1986, pp. 29–48.

TMS320C25 User's Manual, Texas Instruments Japan, Ltd., p. 3-2-3-6, 1989.

Primary Examiner—Long T. Nguyen
Attorney, Agent, or Firm—Fay, Sharpe, Beall, Fagan, Minnich & McKee

[57] ABSTRACT

In the digital signal processor used for realizing application filters, the filter output calculation processing system 5 and the tap coefficient update calculation processing system 6 are separated. In the update calculation processing system 6, the integrating calculation for the tap coefficient updating that requires read and write operations on the data memory DRM is performed in one machine cycle by using the dedicated data bus 10 and executing the read-modify-write operation on the data memory. As a result, to the extent that the time taken by the integrating processing which has conventionally required two machine cycles can be shortened, the operation clock frequency can be lowered to reduce the power consumption while maintaining the processing capability per unit of time.

20 Claims, 7 Drawing Sheets

ARITHMETIC CIRCUIT, AND ADAPTIVE FILTER AND ECHO CANCELER USING IT

BACKGROUND OF THE INVENTION

The present invention relates to an arithmetic circuit, an adaptive filter and an echo canceler, each formed as a semiconductor integrated circuit, and more specifically to a technique effectively applied for reducing the power consumption of, for example, an echo canceling LSI for ISDN (Integrated Services Digital Network).

Adaptive filters such as transversal filters are the ones that can change their characteristics in response to changes over time in the input signal. That is, this kind of filter performs two calculations: an output calculation whereby the input signal is multiplied by tap coefficients and the multiplied values are summed up for a predetermined number of taps to produce a filter output; and an update calculation consisting of multiplication and addition whereby the tap coefficients are updated according to an error signal which is the difference between the filter output and a signal from a certain object system to which the filter output is made to respond. According to the result of the update calculation, the filter rewrites the tap coefficients in chronological order so as to change the filter characteristics in real time. Where such an adaptive filter is formed by a digital signal processor, the updating of the tap coefficients can be realized by an integral processing which involves adding an update amount to a tap coefficient read out from memory and writing the updated tap coefficient into the same address.

The digital signal processor has in addition to the arithmetic and logic unit a multiplier as hardware, which makes multiplication and addition more efficient, improving the real time digital signal processing capability. As an example of this kind of digital signal processor may be united a DSP "TMS320C25," introduced in user's manual for second-generation digital signal processor TMS320C25, p. 3-2-p. 3-6, 1989 published by Texas Instruments Japan, Ltd.

SUMMARY OF THE INVENTION

The conventional digital signal processor represented by the above-mentioned TMS320C25 uses a common internal bus for data transfer between the data RAM (Random Access Memory) and the arithmetic and logic unit. The access to the data RAM is either read or write operation in each machine cycle. Hence, an integral processing that uses the data RAM, such as the tap coefficient update processing for the adaptive filter, requires at least two machine cycles to read from and write into the data RAM, making it impossible to perform in one machine cycle a series of processing including the integral calculation even when they are pipelined.

The inventor of this invention conducted research on the method of reducing power consumption of an LSI for ISDN, one of LSIs used to realize adaptive filters. In the course of our study, the inventor has found that reduction of power consumption is impeded by the integral processing, like the tap coefficient update processing, which takes two or more machine cycles. In the ISDN where terminals of subscribers are connected to communications lines of an exchange, the LSIs are supplied with power from the exchange, giving rise to demands for lower power consumption of the LSIs. In an effort to meet the requirements, the inventor lowered the operation clock frequency to reduce the LSI's power consumption. The inventor also tried to prevent a reduction in the processing capability per unit of time due to the operation speed drop, by reducing the number of machine cycles required by a series of processing. However, because the integral processing such as the tap coefficient update processing that performs many repetitive calculations requires two or more machine cycles, the power consumption of the LSI cannot be reduced without degrading the processing capability per unit of time.

Furthermore, since the tap coefficient update processing in the adaptive filter is required to be sequentially carried out for all taps in one sampling period of input signal, the processing capability per unit of time must be increased in proportion to the number of taps. In this respect, the echo canceler has even greater demands for higher processing capability per unit of time resulting in correspondingly larger power consumption. This is because the echo canceler, which cancels echo components entering the receiving side from the sending side through a balancing network circuit, must cope with uncertainties of impedance mismatch between the arbitrarily connected communications line and the terminal and therefore must be realized by an adaptive filter with relatively many taps. The inventor, therefore, has found it urgent particularly with the echo canceler to reduce the power consumption and at the same time guarantee the specified processing capability per unit of time in the integral processing such as the tap coefficient update processing.

In the tap coefficient update processing, the update amount is given a convergence coefficient to make small the time constant of a transfer function and thereby stabilize the response. For this purpose, the number of bits of the tap coefficients held in the data RAM as integral values is made larger than that for the tap coefficients that are to be summed up to produce the application filter output. With the conventional configuration where the tap coefficients to be used for the update processing are transferred between the arithmetic and logic unit and the data RAM through the common internal data bus, the number of bits of the common internal data bus must satisfy the bit number of the tap coefficients that are to be updated and therefore, as the inventor has found, the power consumption due to precharge and discharge of the common internal data bus with relatively large capacitive load components becomes large to an extent that cannot be neglected.

An object of this invention is to provide an arithmetic circuit that can implement in one machine cycle a series of calculations that involves sequentially rewriting the values to be integrated and accumulating them at a specified memory address. Another object of the invention is to provide an adaptive filter that can perform an integration calculation like the tap coefficient update processing in one machine cycle. A further object of the invention is to provide an adaptive filter and an echo canceler that can reduce power consumption and still guarantee the specified processing capability per unit of time.

The aforementioned and other objects and novel features of this invention will become apparent from the following description in this specification and the accompanying drawings.

Representative features of the invention disclosed in this application may be briefly outlined as follows.

An arithmetic circuit is provided with a data memory which allows the read and write operations on the same address to be performed in one machine cycle. In the arithmetic circuit the output of an arithmetic means is coupled to the input of the data memory and the output of the data memory is coupled to one of inputs of the arithmetic means so that the values to be integrated are successively rewritten and stored in specified addresses in the data memory.

The arithmetic circuit can be used as an integrating circuit of the tap coefficient update calculation means in the adaptive filter formed on a semiconductor integrated circuit. The adaptive filter includes two means: a filter output calculation means which multiplies the tap coefficient with the input signal and adds up the multiplied values for a plurality of taps to obtain the filter output; and a tap coefficient update calculation means which updates the tap coefficient according to an error signal generated as a difference between the filter output and the signal from a target system to which the filter output should respond.

In the adaptive, filter, the number of bits of the common internal data bus used to feed the tap coefficient to the filter output calculation means is preferably fewer than that of the dedicated data bus contained in the integrating circuit in light of reduced power consumption and the narrowed bus width is still sufficient in terms of the function of the adaptive filter.

The adaptive filter can be formed of a digital signal processor, which is fabricated on a semiconductor integrated circuit. To pipeline the tap coefficient update calculation processing and the filter output calculation processing, hardware means for each processing are separated for their own dedicated purposes. Further, the tap coefficient update calculation means includes a multiplication means to multiply the input signal and the error signal and a means to apply a convergence factor to the result of multiplication, these means being interposed between the other input of the arithmetic means and the common internal data bus in the integrating circuit. The filter output calculation means is provided with a multiplication means for multiplying the input signal and the tap coefficient read from the data memory and transferred through the common internal data bus, and also with a means for adding the multiplied value and the tap coefficient and storing the result of addition.

The adaptive filter mentioned above can reduce its power consumption while maintaining the processing capability per unit of time, as explained later, and therefore it is suitable for echo cancelers that must be realized by adaptive filters that need a relatively large number of taps.

The above arithmetic circuit has a dedicated data bus through which the data read out from the data memory is given to the arithmetic means in the same machine cycle as the read operation and through which the calculated data is written into the same address of the data memory in that same machine cycle. In this way the values to be integrated are successively written into the specified addresses of the data memory, allowing the integrating calculation to be performed in one machine cycle. Further, since the dedicated data bus that couples the data memory and the arithmetic means does not have to make data transfers to other modules, its data transfer path can be made relatively short, which in turn reduces unwanted load components in the data transfer path, contributing to an increased speed of the data transfer and lower power consumption.

In the update calculation means of the adaptive filter, the integrating circuit using the above calculation circuit enables the integrating processing, whose read and write operations on the data memory have conventionally been performed in separate machine cycles, to be carried out in one machine cycle.

The fact that each cycle of the integrating processing, such as the tap coefficient update calculation, that has many repetitive calculations is realized in one machine cycle offers the advantages of being able to reduce the power consumption by lowering the operation clock frequency of the LSI making up the application filter and also to reduce the number of machine cycles in one sequence of processing to prevent degradation of the processing capability per unit of time, which would otherwise result from the reduction in the clock frequency and the operation speed. In other words, this configuration realizes reduction in power consumption of the LSI making up the application filter while retaining the processing capability per unit of time.

As to the tap coefficient, its variation time constant need be set to a moderate value in order to stabilize the response of the adaptive filter output. To this end, the number of bits of the tap coefficient held in the data memory as an integral value is made larger than that of the tap coefficient to be added for producing the adaptive filter output, thereby making relatively small the variation time constant of the effective tap coefficient. To realize such calculation, the tap coefficient transfer path for the tap coefficient update calculation is made a dedicated data bus. This in turn permits the common internal data bus to be formed relatively narrow in bit number and thus reduces the power consumption due to precharge and discharge of the common internal data bus with relatively large capacitive load components, when compared with the conventional configuration where the tap coefficient is transferred between the arithmetic and logic unit and the data memory through the common internal data bus.

DESCRIPTION OF THE PREFERRED EMBODIMENTS

Figure 6:
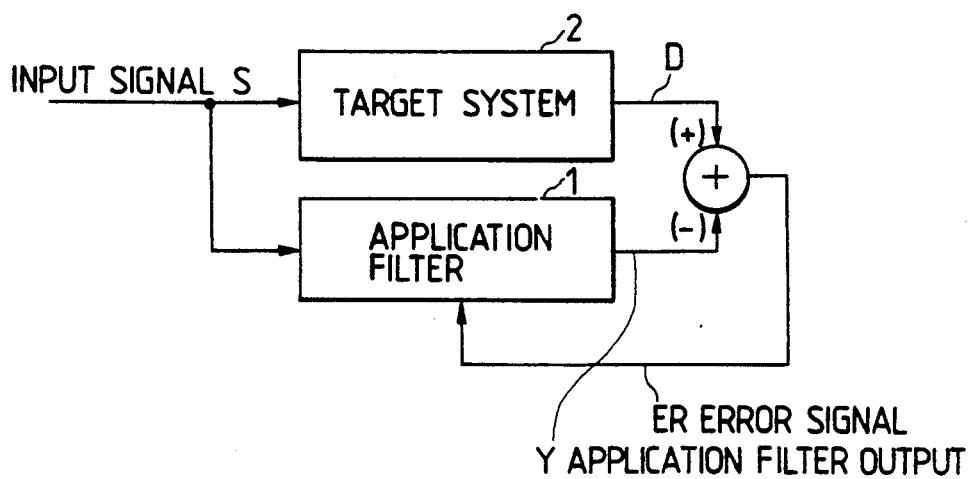
FIG. 6 is one example schematic diagram of an application model that estimates the output of the target system by the adaptive filter.

FIG. 6 shows one example of an applied model that estimates the output of the target system by means of an adaptive filter. The adaptive filter 1 receives the difference between the output D of the target system 2 and the output Y of the application filter 1 as an error signal ER, and functions to minimize the error signal ER, i.e., it responds in the same way as the target system 2. In this model, when the output of the target system 2 is an echo of input signal S, the adaptive filter 1 works as an echo canceler.

Figure 5:
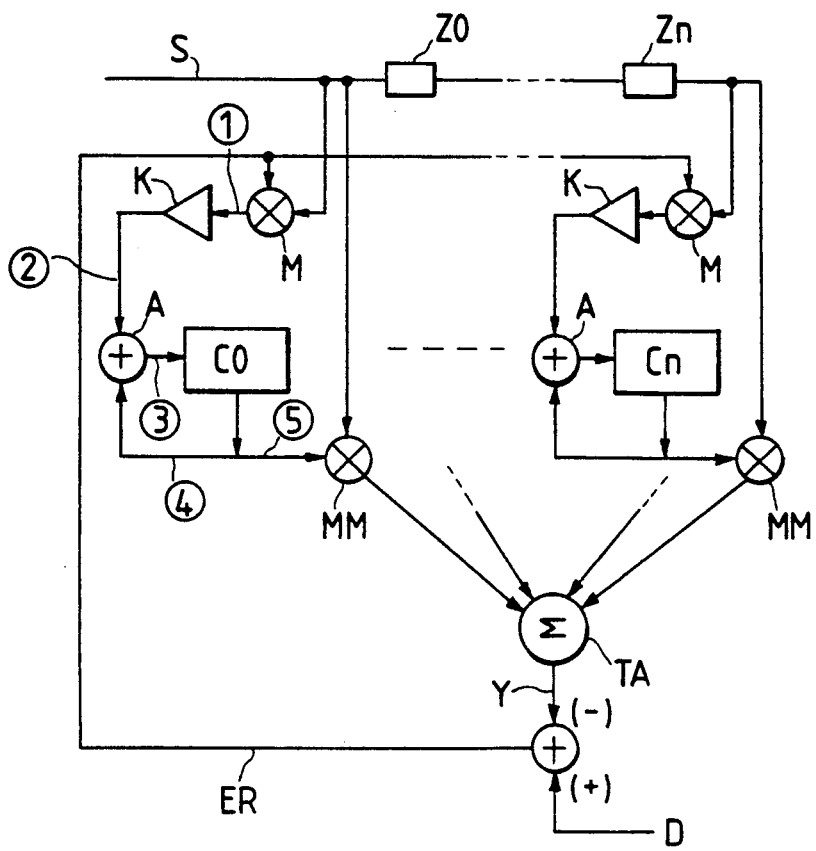
FIG. 5 is a schematic diagram showing one example algorithm of the adaptive filter.

FIG. 5 shows one example of algorithm for the adaptive filter of the transversal type. In the figure, symbol S represents an input signal; symbol Z represents delay elements that, for example, successively hold the input signals S for a delay time that corresponds to the sampling period of the input signal S; and symbols $C_0$ to $C_n$ indicate tap coefficients. The adaptive filter repeats chronologically the similar processing for each tap. The processing is roughly divided into two parts: an output calculation processing that multiplies the input signal S with a corresponding tap coefficient (MM) and adds up the multiplied values for all taps (TA) to produce the filter output Y; and a tap coefficient update processing that updates the tap coefficients according to the error signal ER which is generated based on the difference between the filter output Y and the signal D from the target system to which the filter output Y is made to respond. The tap coefficient update processing consists in multiplying the error signal ER with the input signal S (M), applying a tap update factor or convergence factor to the multiplied value (K) to obtain an update amount for the tap coefficient, and adding this update amount to the previous tap coefficient (A) to produce a new or updated tap coefficient. The updated tap coefficients are stored in data memory, assigned with unique addresses. The tap coefficients are fed both to the multiplication MM in the output calculation processing and to the addition A in the tap coefficient update processing for the filter. The tap coefficient updated by the addition A is written into the data memory at the same address.

Figure 1:
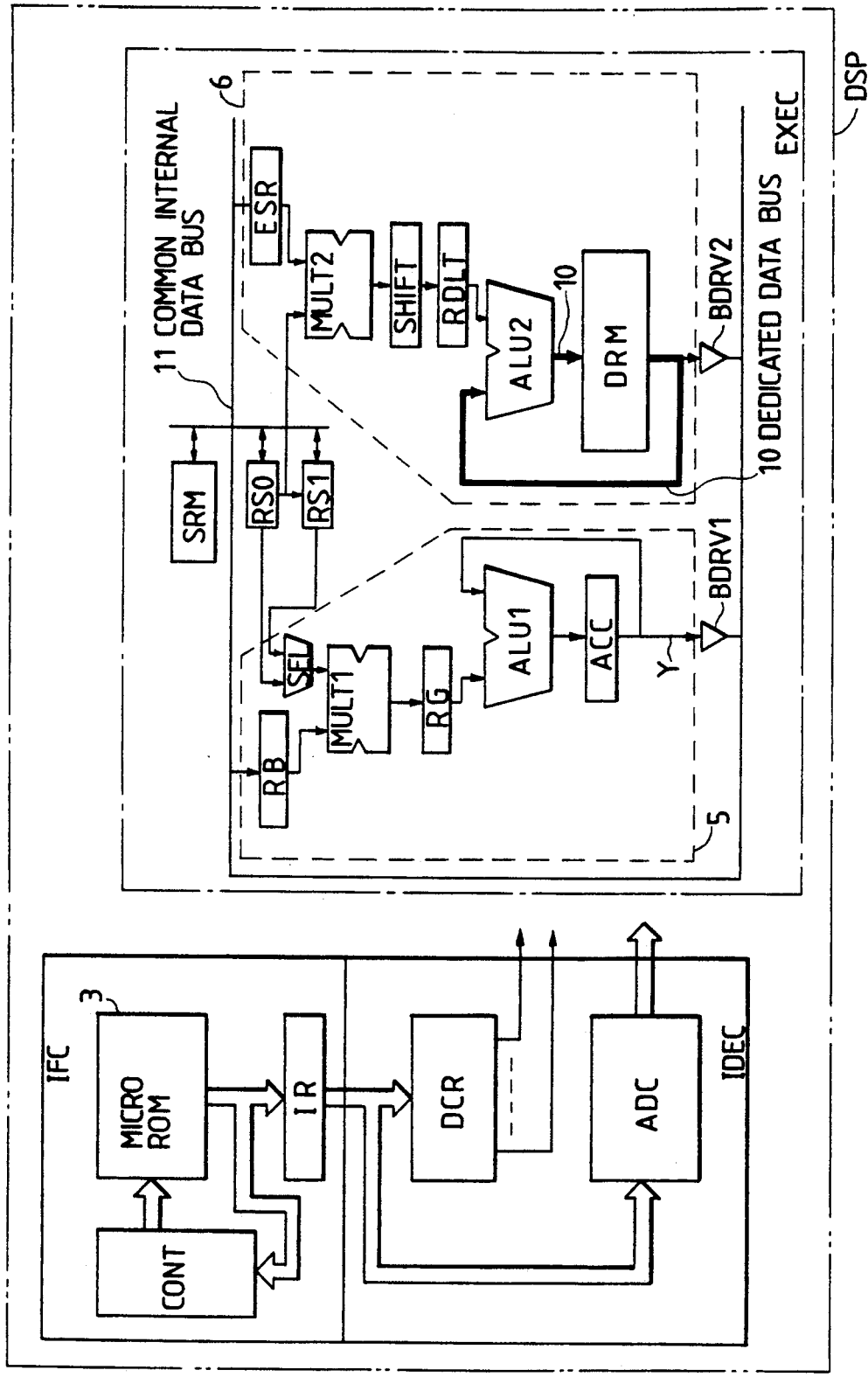
FIG. 1 is an example block diagram of a digital signal processor which has an arithmetic circuit of the invention used to form the application filter.

FIG. 1 shows one example configuration of the digital signal processor DSP which has an arithmetic circuit EXEC that forms the adaptive filter. The digital signal processor DSP in the figure may be formed on a semiconductor substrate such as a silicon substrate using a known semiconductor fabrication technique. In the figure, symbol DRM represents data memory to hold the tap coefficients $C_0$ to $C_n$ at corresponding addresses; and symbol SRM represents symbol memory like shift register that works as a delay element.

Referring to FIG. 1, an instruction fetch circuit IFC includes a micro ROM 3, an instruction register IR, and a control circuit CONT. An instruction decode circuit IDEC includes an instruction decoder DCR and an address generating circuit ADC. The micro ROM 3 stores a microprogram made up of microinstructions. The microinstructions each contain one or more micro operation information, address information such as next micro address for controlling the order of micro instruction sequence, constants information as required by microinstructions, and time information for controlling timings. The micro ROM 3 reads out a microinstruction in response to the address signal output from the control circuit CONT and feeds it to the instruction register IR. Using the micro address information contained in the next address field of the microinstruction, the control circuit CONT generates second and subsequent micro addresses and branch addresses in a specified micro sequence, as well as start micro addresses of command fetch routines and other routines. The instruction decoder DCR decodes the microinstruction supplied from the micro ROM 3 through instruction register IR to generate a variety of control signals, such as read/write control signals that control the operation of writing or reading data to or from the data memory DRM or symbol memory SRM. The calculation circuit EXEC includes registers $RS_0$, $RS_1$, RB, RG, ESR, RDLT, selector SEL, accumulator ACC, multipliers $MULT_1$, $MULT_2$, arithmetic and logic units $ALU_1$, $ALU_2$, and bus drivers $BDRV_1$, $BDRV_2$, all these components being controlled by control signals supplied from the instruction decoder DCR. The address generating circuit ADC decodes the microinstruction supplied from the micro ROM 3 through instruction register IR to generate a specified address and send it to the data memory DRM and the symbol memory SRM. The data memory DRM and symbol memory SRM are written or read according to the control signal from the instruction decoder DCR and to the address from the address generating circuit ADC.

The arithmetic circuit EXEC is dedicated for the adaptive filter and has an output calculation processing circuit 5 and an update calculation processing circuit 6, separate from each other.

The filter output calculation processing circuit 5 consists of an input register RB, selector SEL, multiplier $MULT_1$, output register RG, arithmetic and logic unit $ALU_1$, and accumulator ACC. The input signal read out from the symbol memory SRM is transferred by the selector SEL from one of the registers $RS_0$, $RS_1$ to one of input terminals, not shown, of the multiplier $MULT_1$. The tap coefficient read out from the data memory DRM is given to the other input terminal, not shown, of the multiplier $MULT_1$ through the input register RB. The multiplier $MULT_1$ performs multiplication operation on the input tap coefficient (multiplication processing MM of FIG. 5) and supplies the multiplied value through the output register RG to one of input terminals, not shown, of the arithmetic and logic unit $ALU_1$. The arithmetic and logic unit $ALU_1$ receives from the other input terminal an add value stored in the accumulator ACC to add up the output value from the register RG and the output value from the accumulator ACC (addition processing TA of FIG. 5). Then the arithmetic and logic unit $ALU_1$ outputs the result of addition to the accumulator ACC. When the arithmetic and logic unit $ALU_1$ has added up all the tap outputs for one sample signal, it outputs the value held by the accumulator ACC as the filter output Y onto the common internal data bus 11 through a bus driver $BDRV_1$.

The tap coefficient update calculation processing circuit 6 consists of a register ESR, multiplier $MULT_2$, shifter SHIFT, register RDLT, arithmetic and logic unit $ALU_2$, and data memory DRM. The register ESR contains an error signal. The multiplier $MULT_2$ multiplies the error signal by an input signal from the register $RS_0$ (multiplication processing M of FIG. 5), and the result of multiplication is shifted a specified number of bits by the shifter SHIFT (update factor K application processing of FIG. 5) and then held by the register RDLT. The arithmetic and logic unit $ALU_2$ adds up the tap coefficient update amount held by the register RDLT and the tap coefficient supplied from the data memory DRM (addition processing A of FIG. 5). The updated tap coefficient is then written into the same address in the data memory DRM.

The arithmetic and logic unit $ALU_2$ and the data memory DRM form an integrating circuit because the tap coefficients read from the data memory DRM are added with the update amount and then successively written again into the same addresses in the data memory DRM. The data transfer path through which the tap coefficient read from the data memory DRM is fed to the arithmetic and logic unit $ALU_2$ is formed by a dedicated data bus 10. The data memory DRM operates in a so-called read-modify-write mode which performs read and write operations in one machine cycle. The machine cycle characterizes the operation of the arithmetic circuit EXEC of FIG. 1. The dedicated data bus 10 is not shared by other circuit modules but is arranged locally so that the entire length of the bus signal line is minimal, making the unwanted load component very small, allowing the transfer of the tap coefficients to the arithmetic and logic unit $ALU_2$ to be carried out at high speed. This in turn permits the data memory DRM to be read, modified and written easily. Hence, the integrating calculation for updating the tap coefficient for a single tap can be done reliably in one machine cycle. If we let the number of signal lines making up the common internal data bus be m and the number of signal lines making up the dedicated data bus 10 be n, then the relationship $m < n$ holds.

The tap coefficient read from the data memory DRM is also supplied to the register RB via the common internal data bus 11 for filter output calculation. In this case when there is a possibility that the transfer of the tap coefficient on the dedicated data bus 10 may be delayed because of the direct connection of the dedicated data bus 10 to the common internal data bus 11, it is advised that a bus driver $BDRV_2$ that works as a buffer be put between the common internal data bus 11 and the dedicated data bus 11. While the bus drivers $BDRV_1$, $BDRV_2$ are actually provided in numbers equal to those of signal lines (m) that make up the common internal data bus 11, only one each is shown for simplicity.

Figure 8:
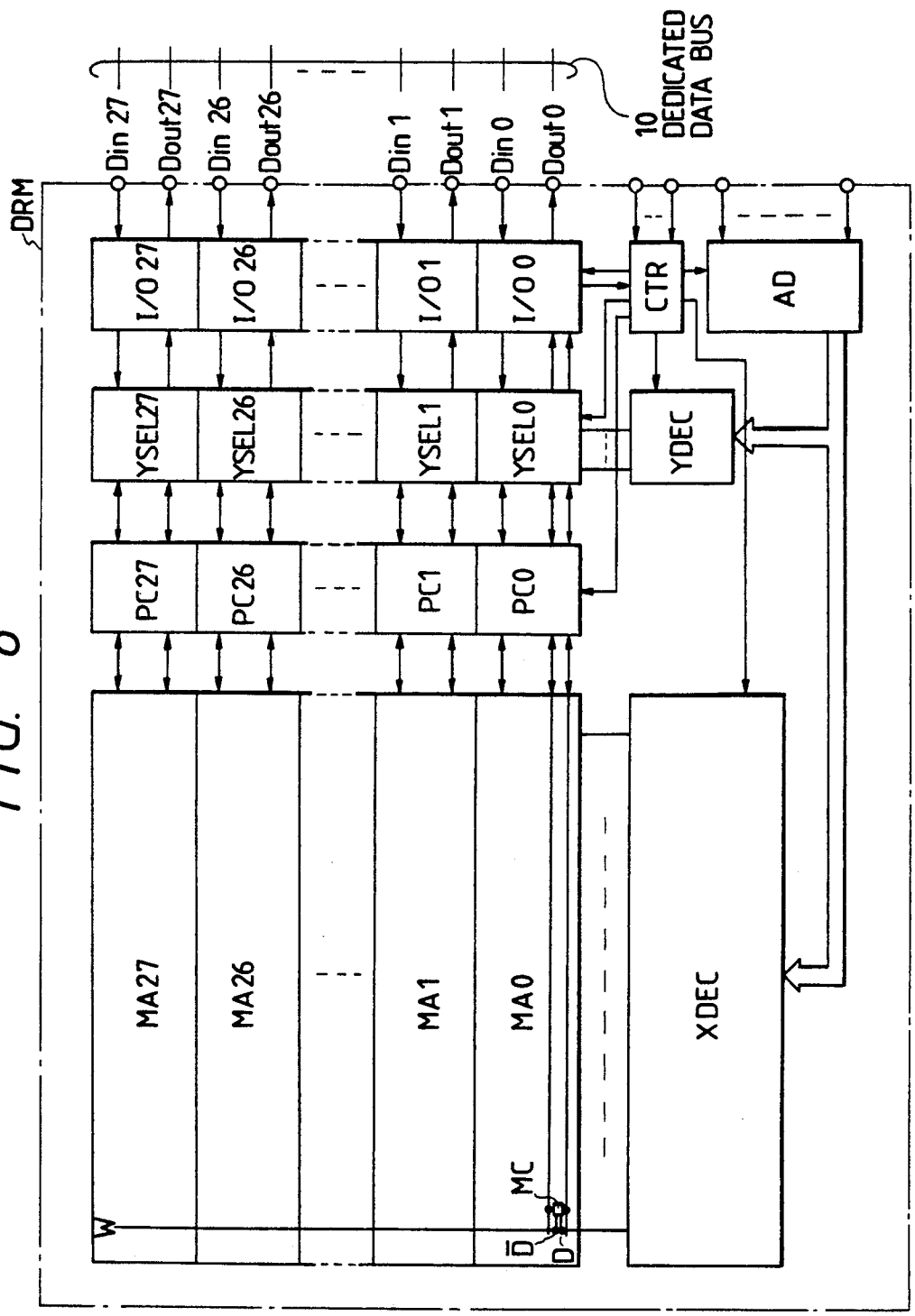
FIG. 8 is a schematic diagram showing the configuration of data memory.

FIG. 8 shows the configuration of the data memory DRM. The data memory DRM consists of memory arrays $MA_0-MA_{27}$, precharge circuits $PC_0-PC_{27}$ for precharging data lines in the memory arrays $MA_0-MA_{27}$, a word line selection circuit XDEC, a data line selection circuit YDEC, data line coupling circuits YSEL, a control circuit CTR, and address decoder AD. The address supplied from the address generating circuit ADC is decoded by the address decoder AD and sent to the word line selection circuit XDEC and the data line selection circuit YDEC. The word line selection circuit XDEC selects one of multiple word lines in the memory arrays $MA_0-MA_{27}$ according to a signal from the address decoder AD. The data line selection circuit YDEC, according to the signal from the address decoder AD, selects a pair of data lines from among multiple data lines in each memory array $MA_0-MA_{27}$. The data line coupling circuit YSEL, according to the signal from the data line selection circuit YDEC, couples memory cells connected to the selected word line to data input/output circuit $I/O_0-I/O_{27}$. The control circuit CTR generates an operation control signal based on a control signal fed from the instruction decoder DCR and supplies it to each circuit block in the data memory DRM. In this way, data is written into and read from the data memory DRM.

Figure 9:
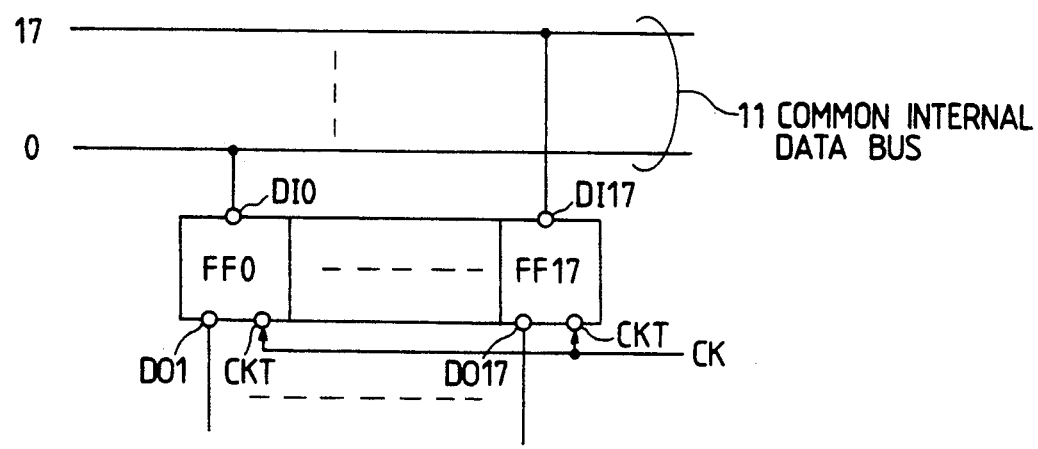
FIG. 9 is a schematic diagram showing the configuration of a register.

FIG. 9 shows the configuration of the registers RB, ESR, $RS_0$, $RS_1$. As shown in the figure, these registers each consist of 18 flip-flops $FF_0-FF_{17}$. The registers receive data from the common internal data bus 11 via data input terminals $DI_0-DI_{17}$ according to a control signal CK supplied from the instruction decoder DCR and forward the data from data output terminals $DO_0-DO_{17}$.

In FIG. 1, the tap coefficient read from the data memory DRM is also sent to the register RB through the common internal data bus 11 for filter output calculation. The tap coefficient supplied to the register RB through the common internal data bus 11 consists, for example, of 18 bits. The data memory DRM holds each tap coefficient in, for example, 28 bits. This is because, if the bit number of the tap coefficient update amount and that of the tap coefficients $C_0-C_n$ are equal and their bit numbers are too small, the tap coefficient update amount-which is to be updated-will not change (zero) when the tap coefficient update amount and the present tap coefficient $C_0-C_n$ are added up. If the bit numbers of the tap coefficient update amount and the tap coefficient $C_0-C_n$ are too large, the least significant bit of the tap coefficient obtained as a result of adding the update amount and the tap coefficient changes at each addition, making the filter unstable. With the above problems considered, the tap coefficient update amount is set to 18-bit long and the tap coefficient to 28-bit long, the latter being sufficiently longer than the bit number of the tap coefficient update amount, so that a good calculation accuracy is obtained even when the tap coefficient update amount is shifted by the shifter SHIFT (K in FIG. 5). When the tap coefficient is read out from the data memory DRM, all the 28 bits are used for the tap coefficient update calculation A (FIG. 5) and its 18 high-order bits are used for the filter output calculation ((5) in FIG. 5).

To cause the tap coefficient to change slightly at each calculation cycle, the tap coefficient update calculation gives a convergence factor K (FIG. 5) to the update amount and sets the time constant of the transfer function to a small value (making the response sensitivity small) to stabilize the filter response. With this embodiment, the result of multiplying the error signal and the input signal in the multiplier $MULT_2$ ((1) in FIG. 5) is right-shifted, say, n bits by the shifter SHIFT (shifted toward the least significant bit), so that the data in the shifter SHIFT is equal to having been multiplied by 1IN (N is $2^n$) ((2) in FIG. 5). The shifted 28-bit data is then added to a 28-bit tap coefficient to update the latter ((3) in FIG. 5). Because the 28-bit tap coefficient used for tap coefficient updating need only be passed through the dedicated data bus 10, only the dedicated data bus 10 is configured to be 28-bit wide ((4) in FIG. 5), while the common internal data bus 11 is formed 18-bit wide ((5) in FIG. 5) so that it can accommodate the maximum bit number which is dictated by the upper 18 bits of the tap coefficient required for filter output calculation and by the bit number of the error signal. In this way, by forming the tap coefficient transfer path for the update calculation with the dedicated data bus 10, it is possible to reduce the number of bits in the common internal data bus 11 and thereby lower the power consumption due to precharge and discharge of the common internal data bus having relatively large capacitive load components, when compared with the conventional configuration where the tap coefficient used for the update calculation is transferred between the arithmetic and logic unit and the data RAM through the common internal data bus.

Figure 2:
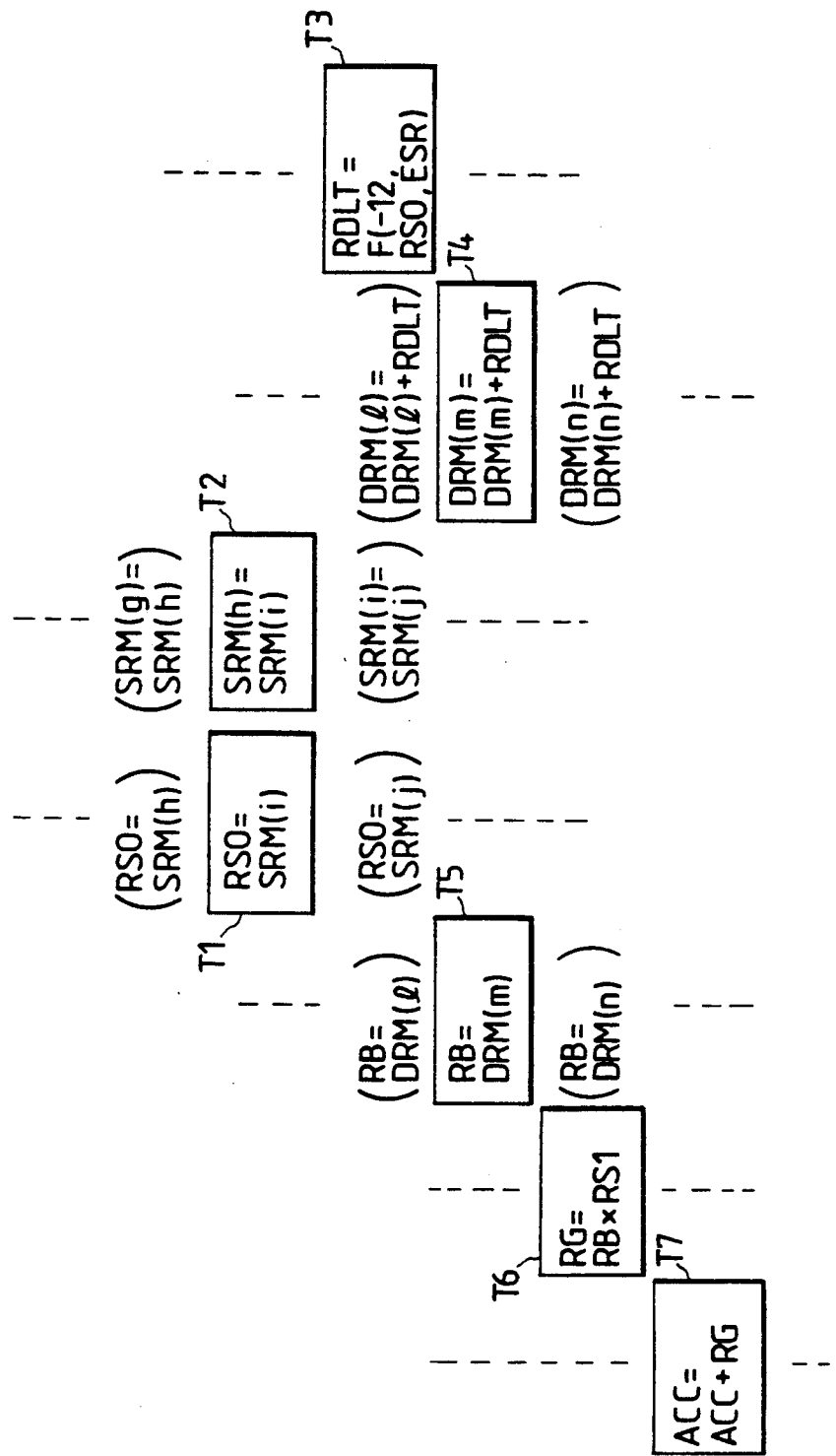
FIG. 2 is an example of micro program flow of processing performed in realizing an adaptive filter that makes use of the arithmetic circuit of FIG. 1.

FIG. 2 shows one example of microprogram flow for realizing the processing of the adaptive filter that uses the calculation circuit of FIG. 1 and follows an algorithm of FIG. 5. In the figure, the processing for one tap ($T_1$ to $T_7$) enclosed in rectangular boxes and processings before and after it are representatively shown. In this microprogram flow, the processing written on one transverse line is executed as one step in one machine cycle. The processing proceeds one step in each machine cycle from the top to the bottom. As shown in the figure, the processing $T_1$-$T_7$ required for one tap can be carried out by five consecutive steps of instruction. Incorporating the processing of the preceding and following taps into each instruction field of the current tap turns the entire processing into a software pipeline processing, which virtually makes the processing for one tap executable by one step.

In FIG. 2, the tap coefficient update calculation is realized by the processing $T_1$ to $T_4$. That is to say, data at address i in the symbol memory SRM is loaded into the register $RS_0$ (processing $T_1$) and at the same time the data in the symbol memory SRM is shifted (processing $T_2$). Next, the error signal in the register ESR is multiplied with the held data in the register $RS_0$ by the multiplier $MULT_2$ and the result is shifted 12 bits toward the least significant bit by the shifter SHIFT to produce a convergence factor (linear convergence) which is then held in the register RDLT (processing $T_3$). Then, the tap coefficient is read out from the address m in the data memory DRM and is given via the dedicated data bus 10 to the arithmetic and logic unit $ALU_2$ where it is added with the value of the register RDLT. The added value is again written into the address m in the data Memory DRM, thus updating the tap coefficient (processing $T_4$). The processing $T_4$, although it includes the read and write operations on the data memory DRM, is executed in one machine cycle as mentioned above.

The filter output calculation processing for one tap is achieved by the processing $T_5$ to $T_7$. That is, in parallel with the processing $T_4$, the processing $T_5$ is carried out in which the tap coefficient read from address m in the data memory DRM has its high-order 18 bits loaded into the register RB through the common internal data bus 11. Then the value in the register RB is multiplied by the value in the register $RS_1$ by the multiplier $MULT_1$ and is held in the register RG (processing $T_6$). This is followed by the arithmetic and logic unit $ALU_1$ adding up the value held in the accumulator ACC and the value in the register RG. The added value is then returned to the accumulator ACC, thus completing the filter output calculation processing for one tap.

As can be seen from FIG. 2, while the processing for one tap requires five machine cycles, the software-pipelining of the five steps virtually allows the processing for one tap to be completed in one machine cycle. This is made possible by the provision of two dedicated processing systems-the tap coefficient update processing system 6 and the filter output calculation processing system 5 as shown in FIG. 1-and by the use of the dedicated data bus 10 through which the tap coefficient is transferred in performing in one machine cycle the integrating calculation for the tap coefficient updating that requires read and write operations on the data memory DRM.

Figure 3:
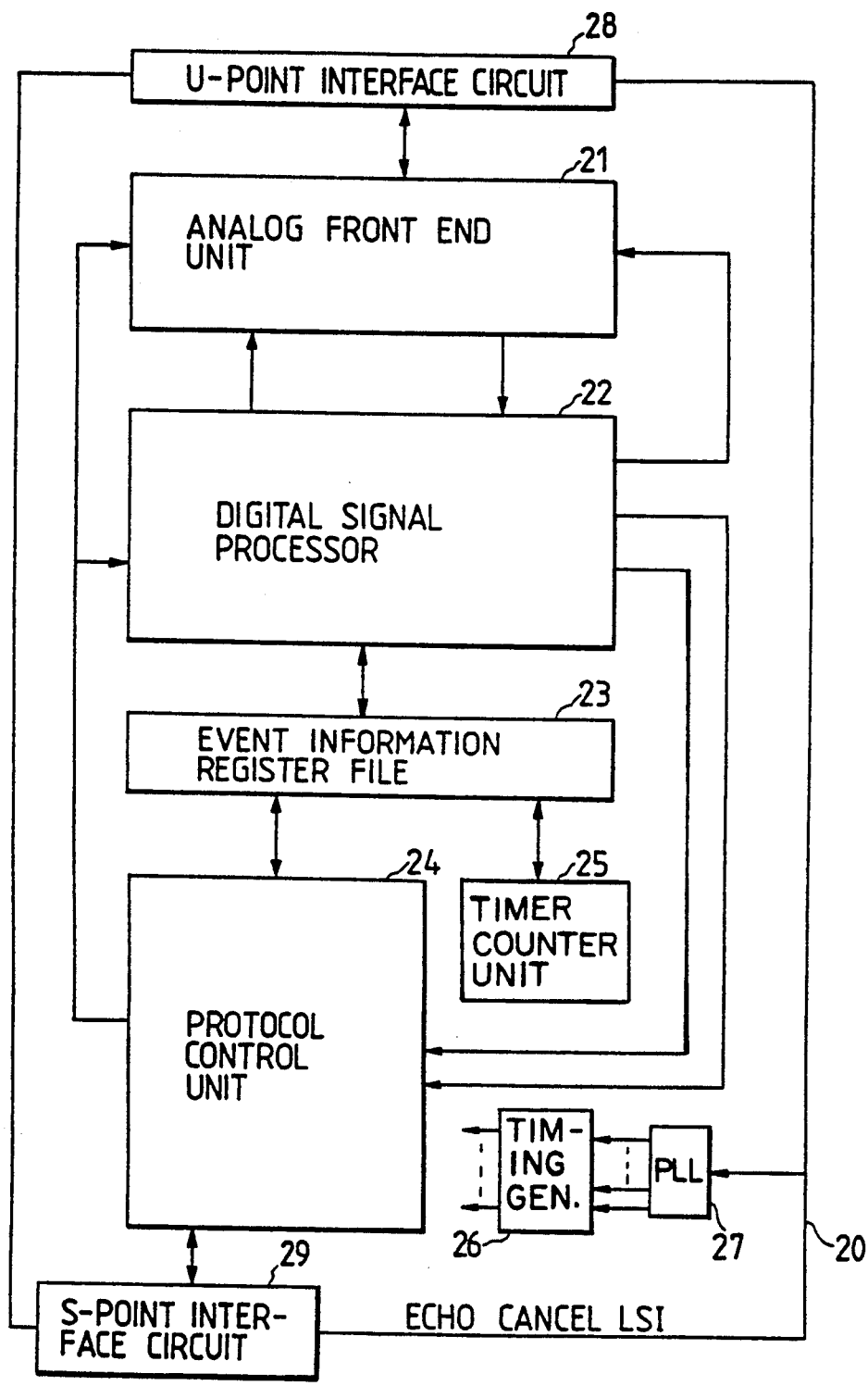
FIG. 3 is an example block diagram of an echo cancel LSI that uses the arithmetic circuit of FIG. 1.

FIG. 3 illustrates one example of an echo cancel type waveform equalization LSI (also referred to simply as an echo cancel LSI hereafter) which as an LSI for ISDN uses the digital signal processor DSP of FIG. 1. The echo cancel LSI 20 performs a full-duplex digital data transmission at a basic rate of 2B+D (two 64-kbps audio channels and one 16-kbps data channel). It performs, through the state transition control, digital signal processing to output transmission data, identify reception data, and cancel (echo-cancel) the interference with the receiving circuit by the transmission data. The echo cancel LSI takes a cycle defined by the frequency of, say, 80 kHz as a unit interval for one data, and performs such processing as detection of transition state, setting of a state, and a digital signal processing in each interval.

The echo cancel LSI 20 includes an analog front end unit 21, digital signal processor 22, event information register file 23, protocol control unit 24, timer counter unit 25, timing generator 26, analog phase-locked loop circuit 27, U-point interface circuit 28, and S-point interface circuit 29, and is formed on a single semiconductor substrate such as a silicon substrate as by a known Bi-CMOS process.

The digital signal processor 22 consists of the instruction fetch circuit, instruction decode circuit and calculation circuit, as shown in FIG. 1. The instruction fetch circuit references the event information register file 23, executes the microprogram according to a predetermined procedure, and makes the calculation circuit work as an adaptive filter to realize the echo canceling. The analog front-end unit 21 performs the A/D conversion on the signal to be transmitted and the D/A conversion on the received signal. The digital signal processor 22 receives the digital signal from the analog front-end unit 21 through the common internal data bus and, according to the instruction in the digital signal processor 22, performs the digital signal processing and outputs the result to the analog front-end unit 21. The U-point interface circuit 28 is connected to the exchange through a hybrid transformer or a balancing network circuit not shown. The event information register file 23 is a register to hold transition states that occur in the digital signal processor 22 and the protocol control unit 24. The processor 22 and the unit 24 detect the transition states set in the event information register file 23 and are controlled accordingly. The protocol control unit 24 performs protocol processing such as frame processing, scrambling, and synchronization. The timer counter unit 25 is used for state transition control and the timing generator 26 generates a variety of operation clocks for the echo cancel LSI and supplies the operation clocks to the associated circuit blocks in the echo cancel LSI. The analog phase-locked loop circuit 27 multiplies a system clock signal fed from outside and supplies it to the timing generator 26. The S-point interface circuit 29 interfaces with the subscriber side.

Figure 4:
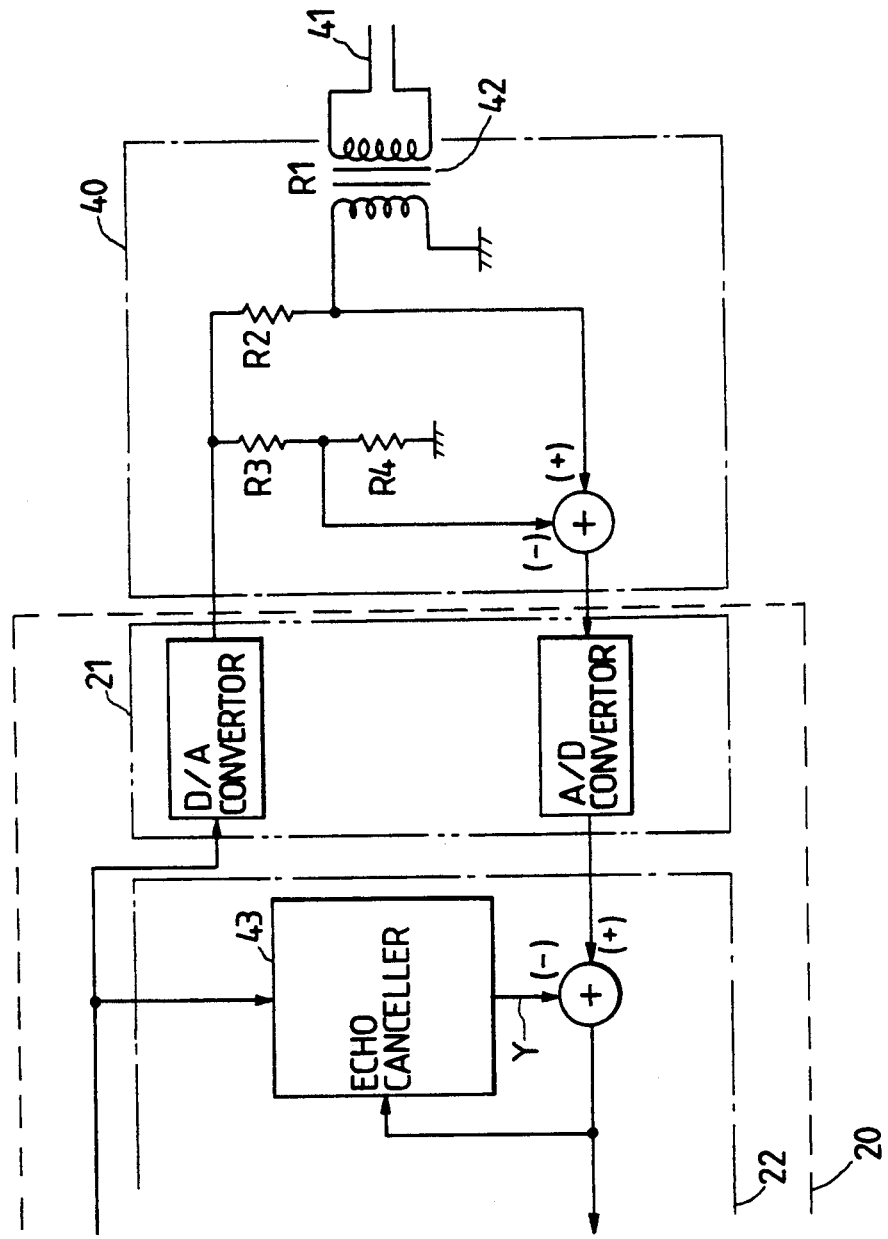
FIG. 4 is an example block diagram showing the echo cancel LSI of FIG. 3 working as an echo canceler.

FIG. 4 shows one example block diagram in which the echo cancel LSI 20 functions as an echo canceler. In the figure, denoted 40 is a balancing network circuit. The data transmitted from the protocol control unit 24 is converted to an analog signal and fed to the balancing network circuit 40, and the received analog signal is converted to a digital signal, which is then supplied to the digital signal processor 22. The echo cancel LSI 20 can perform transmission and reception in parallel, a full-duplex processing. The balancing network circuit 40 has an impedance $R_1$ of transformer 42, a resistor $R_2$ and direct resistors $R_3$, $R_4$ such that the voltage division ratio between the impedance $R_1$ and resistor $R_2$ is equal to that between the direct resistors $R_3$, $R_4$. Subtracting the divided voltage produced by the latter set of resistors from that of the former removes the voltage component of the transmission analog signal from the voltage component applied from the circuit 41 to the transformer 42. In other words, a part of the signal to be sent out via the D/A convertor is prevented from interfering with the A/D convertor side through the transformer 42. The balancing network circuit 40 has its voltage division ratio determined in accordance with the standard that requires the impedance of the circuit 41 to be constant, for example, at 135Ω anywhere on the circuit 41. In reality, however, there are variations in impedance of the circuit and the condition of the circuit changes over time. Furthermore, it is totally impossible to foretell the condition of the circuit to which the balancing network circuit will be connected. Under these circumstances an echo canceler 43 needs to be used to reliably eliminate the echo components entering into the receiving side from the sending side. The echo canceler 43 realizes the algorithm of the application filter of FIG. 5 with the circuit of FIG. 1, and the echo component D is canceled by a signal Y.

Figure 7:
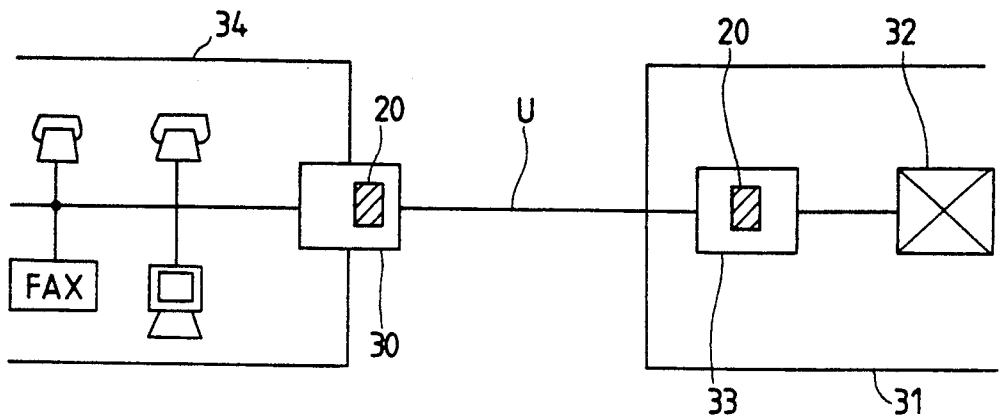
FIG. 7 is a schematic diagram outlining a digital subscriber transmission system using the echo cancel LSI.

FIG. 7 illustrates the outline of a digital subscriber transmission system using the echo cancel LSI 20. In the figure, designated 31 is an exchange office, 32 an exchange, 33 an office channel unit for connecting the exchange 32 to the circuit U, 34 a subscriber station, and 30 a digital service unit that connects the subscriber station 34 to the circuit U. The echo cancel LSI 20 is installed in each of the subscriber station 34 and the exchange office 31. Where the transmitting equipment, such as the digital service unit 30 including the subscriber's echo cancel LSI 20, needs to be totally supplied with power from the exchange office 31 for operation, power feed is done by superimposing dc current on the transmission line U. This means that there is a limit to the amount of power the echo cancel LSI 20 can consume. Designed to cancel the echo components entering from the sending side into the receiving side due to impedance mismatch between the balancing network circuit and the communications line to which it is connected, the echo canceler must cope with uncertainties of such impedance mismatch. This requires the echo canceler to be realized by an adaptive filter having a relatively large number of taps. This in turn calls for a high processing capability per unit of time and thus the power consumption is expected to increase. In this respect, the digital signal processor 22 to realize the echo canceling adaptive filter is provided with a calculation circuit which, as explained in FIGS. 1 and 2, has two dedicated circuits—the tap coefficient update calculation processing circuit 6 and the filter output calculation processing circuit 5—and which employs the dedicated data bus 10 for transferring the tap coefficient to enable the integrating calculation for tap coefficient updating that requires read/write operation on the data memory DRM to be carried out in one machine cycle. In addition, the software-pipelining of five steps makes it possible for the processor to complete the processing for one tap virtually in one machine cycle. Since the adaptive filter realized by the digital signal processor 22 can complete the processing for one tap in one machine cycle, it is possible to keep the processing capability per unit of time from falling even when the operation clock frequency of the LSI is lowered reducing the operation speed. In other words, with the digital signal processor 22 used to realize the echo canceling adaptive filter which is required to have a high processing capability per unit of time and whose power consumption is expected to rise accordingly, it is possible, by lowering the operation clock frequency, to reduce its power consumption while maintaining the processing capability per unit of time.

The invention accomplished by the inventor has been described in the foregoing by referring to an example embodiment. It should be noted, however, that the present invention is not limited to the above embodiment alone but various modifications may be made without departing from the spirit of the invention.

For example, while in the arithmetic circuit of FIG. 1, the data memory DRM is shown as a RAM having dual ports, it may be a single-port RAM. The bit numbers of the dedicated data bus and the common internal data bus are not limited to those of the embodiment and may be changed as necessary according to the number of bits in the filter output and the tap coefficient of the adaptive filter. Further, while the above embodiment has described the linear convergence given by the shifter as an example of the convergence factor used in the tap coefficient update processing, it is possible, where the response sensitivity is lowered, to use a sine convergence which adds or subtracts "1" to or from the least significant bit according to the sign of the result of multiplication of the error signal and the input signal. It is also possible to selectively switch between the two types of convergence. Moreover, the adaptive filter of the above embodiment is not limited to the echo canceling application but may be applied to other equalizing processing in the ISDN. In addition to the exchange office as a power source, the LSI may be powered by batteries, with reduction in power consumption similarly achieved.

Although the above description centered around the echo cancel LSI for ISDN the field of application from which this invention has originated, this invention is not limited to this application alone but can widely be applied to arithmetic circuits and adaptive filters that perform such processing as voice compression, voice synthesizing, radio transmission and image emphasizing and also to LSIs for realizing such circuits.

This invention has wide applications, including improvement of the processing capability per unit of time by reducing the machine cycle number, as required in the integrating calculation processing using at least data memory, and reduction in power consumption of LSI in connection with the reduced operation clock frequency.

Representative advantages of the invention disclosed in this application may be briefly outlined as follows.

The calculation circuit consists of data memory which allows the read and write operations on the same address to be carried out in one machine cycle, with the input of the data memory connected with the output of the arithmetic means; and a dedicated data bus through which the output of the data memory is connected to one of inputs of the arithmetic means. Since in this configuration the dedicated data bus, which connects the data memory and the arithmetic means, is not required to make data transfer to and from other modules, its data transfer path can be made relatively short, reducing unwanted load components of the data transfer path and thereby improving the speed of the data transfer. This in turn permits the integrating calculation processing-in which the values to be integrated are successively rewritten and stored into specified addresses in the data memory-to be performed in one machine cycle.

The integrating circuit which employs the above arithmetic circuit in the tap coefficient updating means of the adaptive filter has the advantage of being able to execute in one machine cycle the integrating processing, which has conventionally carried out the read operation and the write operation on the data memory in separate machine cycles.

Since with the above configuration each cycle of the integrating processing in the tap coefficient update calculation, which has a large number of repetitive calculations, can be performed in one machine cycle, the reduction in the operation clock frequency of the LSI making up the adaptive filter to lower power consumption of the adaptive filter does not deteriorate the processing capability per unit of time. In other words, this invention offers the advantage that the LSIs such as echo canceler and digital signal processor that make up the adaptive filters can be reduced in the power consumption while maintaining the processing capability per unit of time.

Particularly for the LSIs, such as echo cancelers, that realize the adaptive filters and which have many taps and are required to have high processing capability per unit of time and thus expected to have increased power consumption, the reduction in power consumption as achieved by this invention by lowering the operation clock frequency while maintaining the processing capability per unit of time is suitable for the system which is centrally fed from the exchange office or supplied by battery and therefore has a limited amount of usable power.

In the adaptive filter, the update amount produced in the tap coefficient update calculation is given a convergence factor to stabilize the response of the filter. Because of this, the number of bits of the tap coefficient held in the data memory as an integral value is made larger than that of the tap coefficient used for addition to produce the adaptive filter output. By making the transfer path used to transfer tap coefficient for the tap coefficient update calculation a dedicated data bus, the number of bits of the common internal data bus can be made relatively small. When compared with the conventional configuration where the tap coefficients are transferred between the arithmetic and logic unit and the data memory through the common internal data bus, the configuration of this invention can reduce the power consumption due to precharge and discharge of the common internal data bus with relatively large capacitive load components. In this respect also, this invention contributes to reducing the power consumption of the adaptive filter.

When the adaptive filter is to be formed by the digital signal processor which is fabricated as a semiconductor integrated circuit, this invention offers the following configuration: that the tap coefficient update calculation processing circuit and the filter output calculation processing circuit are formed as separate and dedicated circuits; and that the dedicated data bus is provided for the integrating calculation performed in the tap coefficient update processing that requires the read and write operation on the data memory. This configuration enables the integrating calculation to be preformed in one machine cycle. Furthermore, the pipelining of the processing permits the processing for each tap to be performed virtually in one machine cycle.

What is claimed is:

1. An arithmetic circuit comprising:
   a register for storing a predetermined data;
   first data bus means, including a plurality of signal lines, and for transferring data;
   memory means including,
     a plurality of word lines, data lines, and a plurality of memory cells for storing data,
     decoding means for selecting one word line from the plurality of word lines according to an address supplied, and
     data input/output means to which the data lines are coupled, wherein the memory means outputs data from the memory cells coupled to the word line selected according to the address;
   arithmetic means having a first input terminal for receiving the predetermined data from the register and a second input terminal for receiving data from the selected memory cells, the arithmetic means performing calculation on the data from the memory cells and the predetermined data from the register, the arithmetic means having an output terminal coupled to the memory means for outputting the calculation result, wherein the result of calculation by the arithmetic means is written from the output terminal of the arithmetic means into the memory cells coupled to the selected word line; and
   data path means, including a plurality of signal lines, and for transferring data from the selected memory cells, wherein the data path means has a part dedicated only to transfer data from the selected memory cells to the second input terminal.

2. The arithmetic circuit according to claim 1, wherein the number of signal lines in the first data bus means is smaller than that of signal lines in the data path means.

3. The arithmetic circuit according to claim 2, further comprising shift means, which is coupled between the first data bus means and the first input terminal through second data bus means, the second data bus means having the same number of signal lines as the data path means, and which shifts data from the first data bus means and outputs the shifted data onto the second data bus means.

4. The arithmetic circuit according to claim 3, further comprising coupling means for coupling the data path means to the first data bus means, wherein the coupling means outputs data from the data path means onto the first data bus means.

5. The arithmetic circuit according to claim 4, wherein the coupling means are provided one for each signal line making up the first data bus means, and the signal lines of the data path means are coupled through the coupling means to the signal lines of the first data bus means beginning with the most significant bit of the data read out from the memory means.

6. The arithmetic circuit according to claim 5, further comprising second arithmetic means for performing calculation on the data output from the coupling means onto the first data bus means and on predetermined data.

7. A digital signal processor comprising:
   instruction memory means for storing instructions;

instruction decode means for decoding instructions read from the instruction memory means to generate control signals;

address generating means for generating addresses from the instructions read from the instruction memory means; and arithmetic means for performing arithmetic operations in accordance with the control signals and the addresses, the arithmetic means including, a register for storing a predetermined data, first data bus means, including a plurality of signal lines, and for transferring data;

data memory means including, memory arrays including a plurality of word lines, data lines, and a plurality of memory cells for storing data, and data input/output means to which the data lines are coupled, wherein the memory means outputs data from the memory cells coupled to the word line selected according to the address;

arithmetic unit having a first input terminal for receiving the predetermined data from the register and a second input terminal for receiving data from the selected memory cells, the arithmetic unit performing calculation on the data from the memory cells and the predetermined data from the register, the arithmetic unit having an output terminal coupled to the memory means for outputting the calculation result, wherein the result of calculation by the arithmetic unit is written from the output terminal of the arithmetic unit into the memory cells coupled to the selected word line; and data path means, including a plurality of signal lines, and of transferring data from the selected memory cells, wherein the data path means has a part dedicated only to transfer data from the selected memory cells to the second input terminal.

8. The digital signal processor according to claim 7, wherein the number of signal lines of the first data bus means is smaller than that of signal lines of the data path means.

9. The digital signal processor according to claim 8, further comprising shift means, which is coupled between the first data bus means and the first input terminal through second data bus means, the second data bus means having the same number of signal lines as the data path means, and which shifts data from the first data bus means and outputs the shifted data onto the second data bus means.

10. The digital signal processor according to claim 9, further comprising coupling mans for coupling the data path means to the first data bus means, wherein the coupling mans outputs data from the data path means onto the first data bus means.

11. The digital signal processor according to claim 10, wherein the coupling means are provided one for each signal line making up the first data bus means, and the signal lines of the data path means are coupled through the coupling means to the signal lines of the first data bus means beginning with the most significant bit of the data read out from the memory means.

12. The digital signal processor according to claim 11, further comprising second arithmetic means for performing calculation on the data output from the coupling means onto the first data bus means and on predetermined data.

13. The digital signal processor according to claim 12, wherein the digital signal processor is formed on a single semiconductor chip.

14. In a communication processing system comprising an analog-to-digital converter for converting analog signals into digital signals, a digital-to-analog converter for converting digital signals into analog signals, and a digital signal processor for receiving digital signals from the analog-to-digital converter and for performing digital signal processing on the signals;

the digital signal processor including: instruction memory means for storing instructions;

instruction decode means for decoding instructions read from the instruction memory means to generate control signals;

address generating means for generating addresses from the instructions read from the instruction memory means; and arithmetic means for performing arithmetic operations, in accordance with the control signals and the addresses, the arithmetic means including, a register for storing a predetermined data, data bus means, including a plurality of signal lines, and for transferring data;

data memory means including, memory arrays including a plurality of word lines, data lines, a plurality of memory cells for storing data, decoding means for selecting one word line from the plurality of word lines according to the address supplied, and data input/output means to which the data lines are coupled, wherein the memory means outputs data from the memory cells coupled to the word line selected according to the address;

arithmetic and logic unit having a first input terminal for receiving the predetermined data from the register and a second input terminal for receiving data from the selected memory cells, the arithmetic and logic unit performing calculation on the data from the memory cells and the predetermined data from the register, the arithmetic and logic unit having an output terminal coupled to the memory means for outputting the calculation result, wherein the result of calculation by the arithmetic and logic unit is written from the output terminal of the arithmetic and logic unit into the memory cells coupled to the selected word line; and data path means, including a plurality of signal lines, and for transferring data from the selected memory cells, wherein the data path means has a part dedicated only to transfer data from the selected memory cells to the second input terminal.

15. The communication processing system according to claim 14, wherein the number of signal lines of the data bus means is smaller than that of signal lines of the data path means.

16. The communication processing system according to claim 15, wherein the digital signal processor is formed on a single semiconductor chip.

17. The communication processing system according to claim 16, wherein the arithmetic and logic unit has coupling means for coupling the data path means to the data bus means, and the coupling means outputs data from the data path means onto the data bus means.

18. The communication processing system according to claim 17, wherein the coupling means are provided one for each signal line making up the data bus mans, and the signal lines of the data path means are coupled through the coupling means to the signal lines of the data bus means beginning with the most significant bit of the data read out from the memory means.

19. The communication processing system according to claim 18, wherein the arithmetic and logic unit has second arithmetic and logic unit for performing calculation on the data output from the coupling means onto the data bus means and on predetermined data.

20. The communication processing system according to claim 19, wherein the digital signal processor cancels echo components supplied from the analog-to-digital convertor by the output data of the second arithmetic and logic unit.

* * * * *

UNITED STATES PATENT AND TRADEMARK OFFICE
CERTIFICATE OF CORRECTION

PATENT NO. : 5,297,071
DATED : March 22, 1994
INVENTOR(S) : Kimihiro Sugino

It is certified that error appears in the above-indentified patent and that said Letters Patent is hereby corrected as shown below:

Claim 7, column 15, line 35, delete "of" and substitute therefor --for--.

Claim 18, column 16, line 68, delete "mans" and substitute therefor --means--.

Signed and Sealed this

Twenty-eighth Day of June, 1994

Attest:

BRUCE LEHMAN

Attesting Officer *Commissioner of Patents and Trademarks*